(12) United States Patent
Lidow et al.

(10) Patent No.: US 8,350,294 B2
(45) Date of Patent: Jan. 8, 2013

(54) COMPENSATED GATE MISFET AND METHOD FOR FABRICATING THE SAME

(75) Inventors: Alexander Lidow, Marina Del Ray, CA (US); Robert Beach, La Crescenta, CA (US); Jianjun Cao, Torrance, CA (US); Alana Nakata, Redondo Beach, CA (US); Guang Yuan Zhao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 123 days.

(21) Appl. No.: 12/756,906

(22) Filed: Apr. 8, 2010

(65) Prior Publication Data

US 2010/0258848 A1  Oct. 14, 2010

Related U.S. Application Data

(60) Provisional application No. 61/167,792, filed on Apr. 8, 2009.

(51) Int. Cl.
*H01L 29/66* (2006.01)

(52) U.S. Cl. ................. 257/192; 257/E29.242

(58) Field of Classification Search .......... 257/190, 257/191, 192, 194, 195
See application file for complete search history.

(56) References Cited

U.S. PATENT DOCUMENTS

| 4,987,462 A | | 1/1991 | Kim et al. | |
|---|---|---|---|---|
| 5,985,687 A | * | 11/1999 | Bowers et al. | 438/46 |
| 6,235,547 B1 | | 5/2001 | Sakuma et al. | |
| 6,537,838 B2 | | 3/2003 | Stockman | |
| 2006/0273347 A1 | | 12/2006 | Hikita et al. | |
| 2008/0006845 A1 | * | 1/2008 | Derluyn et al. | 257/192 |
| 2008/0296618 A1 | * | 12/2008 | Suh et al. | 257/190 |

OTHER PUBLICATIONS

Tsuyukuchi et al., "Low-Leakage-Current Enhancement-Mode AlGaN/GaN Heterostructure Field-Effect Transistor Using p-Type Gate Contact," Japanese Journal of Applied Physics, 2006, Japan Society of Applied Physics, vol. 45, No. 11, p. L319-L321.*

X. Hu, et al. "Enhancement Mode AlGaN/GaN HFET With Selectively Grown pn Junction Gate", *Electronics Letters*, vol. 35, No. 8, pp. 753-754, Apr. 13, 2000.

T. Fuji et al. "High On/Off Ratio in Enhancement-Mode $Al_xGa_{1-x}N$/GaN Junction Heterostructure Field-Effect Transistors with P-Type GaN Gate Contact", *Japanese Journal of Applied Physics*, vol. 45. No. 39, pp. L1048-L1050, 2006.

Y. Uemoto et al. Gate Injection Transistor (GIT)—A Normally-Off AlGaN/GaN Power Transistor Using Conductivity Modulation, *IEEE Transactions on Electron Devices*, vol. 54, No. 12, pp. 3393-3399, Dec. 2007.

* cited by examiner

*Primary Examiner* — Ha Tran T Nguyen
*Assistant Examiner* — Kevin Quinto
(74) *Attorney, Agent, or Firm* — Dickstein Shapiro LLP

(57) ABSTRACT

A MISFET, such as a GaN transistor, with low gate leakage. In one embodiment, the gate leakage is reduced with a compensated GaN layer below the gate contact and above the barrier layer. In another embodiment, the gate leakage is reduced by employing a semi-insulating layer below the gate contact and above the barrier layer.

12 Claims, 13 Drawing Sheets

COMPENSATED GATE MISFET AND METHOD FOR FABRICATING THE SAME

CROSS REFERENCE TO RELATED APPLICATIONS

This application claims priority from U.S. Provisional Application No. 61/167,792 filed on Apr. 8, 2009, which is hereby incorporated by reference in its entirety.

FIELD OF THE INVENTION

The present invention relates to the field of enhancement mode gallium nitride (GaN) transistors. More particularly, the invention relates to an enhancement mode GaN transistor with a compensated GaN layer or a semi-insulating GaN layer below the gate contact and above the barrier layer.

DETAILED DESCRIPTION OF THE INVENTION

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages, e.g., 100 Volts, while operating at high frequencies, e.g., 100 kHz-10 GHz.

A GaN HEMT device includes a nitride semiconductor with at least two nitride layers. Different materials formed on the semiconductor or on a buffer layer causes the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

FIG. 1 illustrates a conventional enhancement mode GaN transistor device 100. Device 100 includes substrate 101 that can be composed of silicon (Si), silicon carbide (SiC), sapphire, or other material, transition layers 102 typically composed of AlN and AlGaN that is about 0.1 to about 1.0 μm in thickness, buffer material 103 typically composed of GaN that is about 0.5 to about 10 μm in thickness, barrier material 104 typically composed of AlGaN where the Al to Ga ratio is about 0.1 to about 0.5 with thickness from about 0.005 to about 0.03 μm, p-type AlGaN 105, heavily doped p-type GaN 106, isolation region 107, passivation region 108, ohmic contact metals 109 and 110 for the source and drain, typically composed of Ti and Al with a capping metal such as Ni and Au, and gate metal 111 typically composed of a nickel (Ni) and gold (Au) metal contact over a p-type GaN gate.

There are several disadvantages of the conventional GaN transistors shown in FIG. 1. One problem is that the leakage current of the gate contact during device conduction is very high due to gate charge injection.

It therefore would be desirable to provide a MISFET, particularly a GaN transistor, that does not leak current during device conduction and that is easier to manufacture.

SUMMARY OF THE INVENTION

The present invention is directed to a MISFET, such as a GaN transistor, with low gate leakage. In one embodiment, the gate leakage is reduced with a compensated GaN layer below the gate contact and above the barrier layer. In another embodiment, the gate leakage is reduced by employing a semi-insulating layer below the gate contact and above the barrier layer.

DETAILED DESCRIPTION OF THE INVENTION

Figure 2:
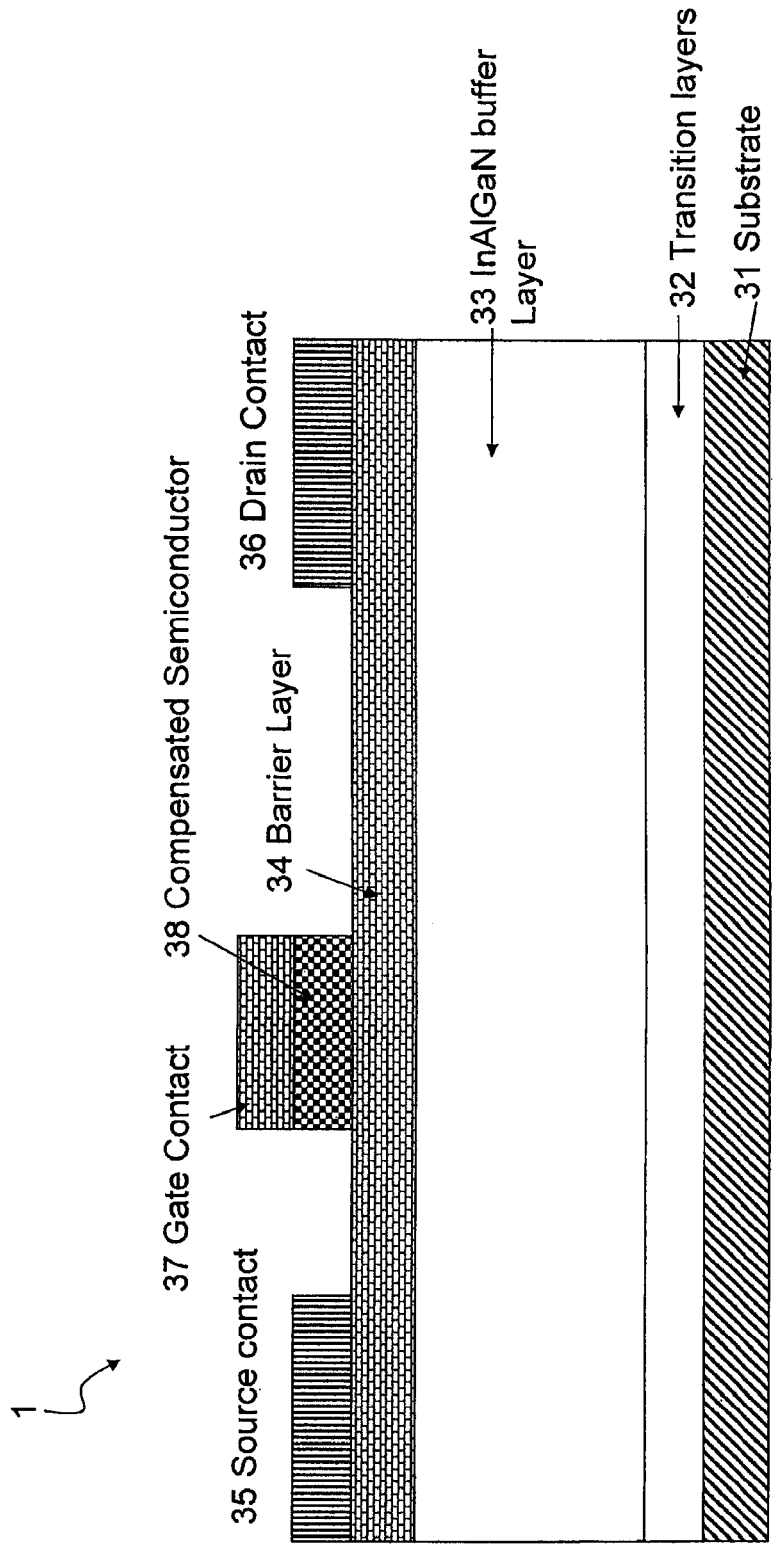
FIG. 2 is a transistor according to an embodiment described herein.

FIG. 2 shows a MISFET in the form of GaN transistor 1 according to an embodiment of the present invention. GaN transistor 1 is formed on a substrate 31 that may comprise, for example, silicon Si, silicon carbide SiC or sapphire. Over and in contact with the substrate 31 are transition layers 32. Transition layers 32 may comprise, for example, AlN or AlGaN, with a thickness of between 0.1 to 1.0 μm. A buffer layer 33 separates the transition layers 32 from a barrier layer 34. The buffer layer 33 is preferably formed of InAlGaN with any concentration of In and Al (including 0% In and/or Al) and has a thickness between 0.5 and 3 μm. The barrier layer 34 is formed of AlGaN and has a thickness between 0.005 and 0.03

µm and an Al percentage of about 10% to 50%. Source and drain contacts 35, 36 are disposed over the barrier layer. Source and drain contacts are formed of Ti or Al with a capping metal such as Ni and Au or Ti and TiN. A gate contact 37, formed of for example, Ta, Ti, TiN, W, or WSi2, and having a thickness of between 0.05 and 1.0 µm, is provided between the source and drain contacts. In accordance with the present invention, a compensated semiconductor layer 38 is formed over the barrier layer 34 and under the gate contact 37. Compensated semiconductor layer 38 preferably comprises AlGaN or GaN with a deep level passivated p-type impurity such as, for example, Mg, Zn, Be, Cd, or Ca. Buffer layer 33 and barrier layer 34 are made of a III Nitride material. A III Nitride material can be composed of $In_xAl_yGa_{1-x-y}N$ where $x+y \leq 1$.

Advantageously, the high doping level of compensated layer 38 leads to enhancement mode devices. In addition, using a compensated semiconductor layer 38 leads to low gate leakage during device operation. Finally, the insulating nature of compensated layer 38 reduces the gate capacitance of the device.

Figure 3:
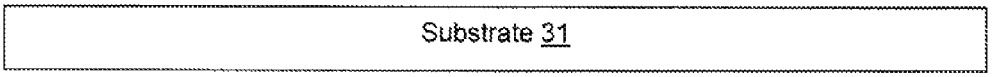
FIG. 3 is a cross-sectional view at a stage of processing.
Figure 4:
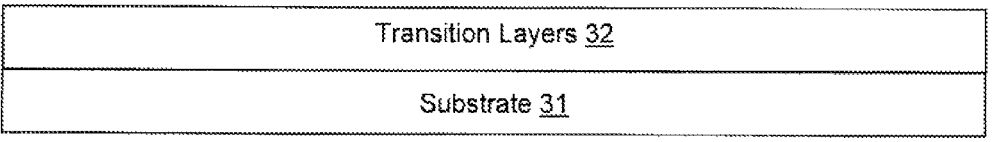
FIG. 4 is a cross-sectional view at a stage of processing subsequent to that shown in FIG. 3.
Figure 5:
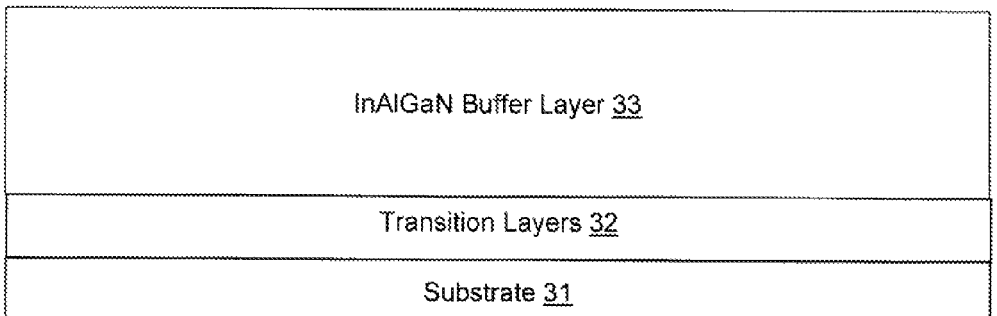
FIG. 5 is a cross-sectional view at a stage of processing subsequent to that shown in FIG. 4.
Figure 6:
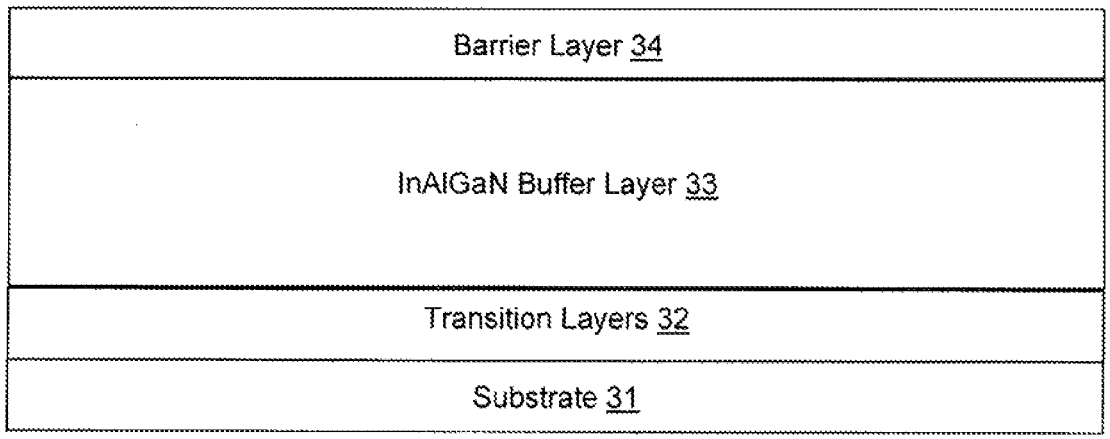
FIG. 6 is a cross-sectional view at a stage of processing subsequent to that shown in FIG. 5.

FIGS. 3-9 describe an example method of manufacturing the GaN transistor 1 shown in FIG. 2. Referring to FIG. 3, the first step is to provide a substrate 31. Referring to FIG. 4, the next step is to nucleate and grow transition layers 32 on top of the substrate 31. Referring to FIG. 5, the next step is to grow a buffer layer 33 over the transistor layer 32. Referring to FIG. 6, the next step is to grow a barrier layer 34 over the buffer layer 33.

Figure 7:
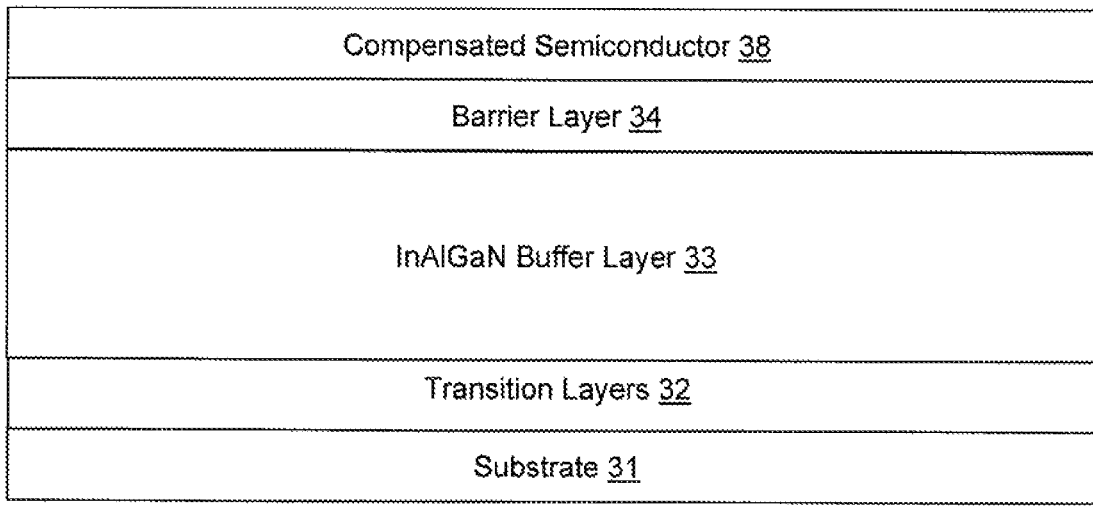
FIG. 7 is a cross-sectional view at a stage of processing subsequent to that shown in FIG. 6.
Figure 8:
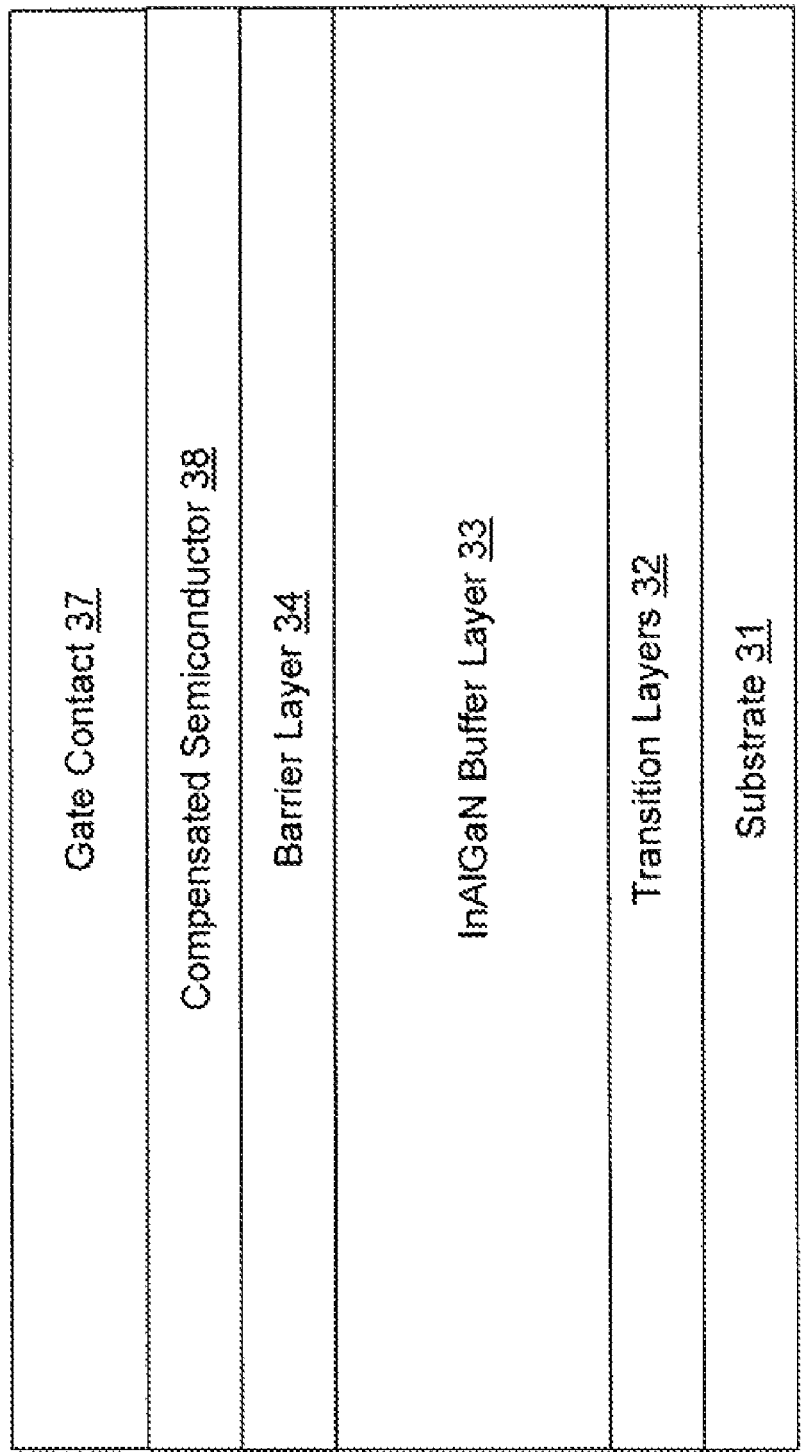
FIG. 8 is a cross-sectional view at a stage of processing subsequent to that shown in FIG. 7.
Figure 9:
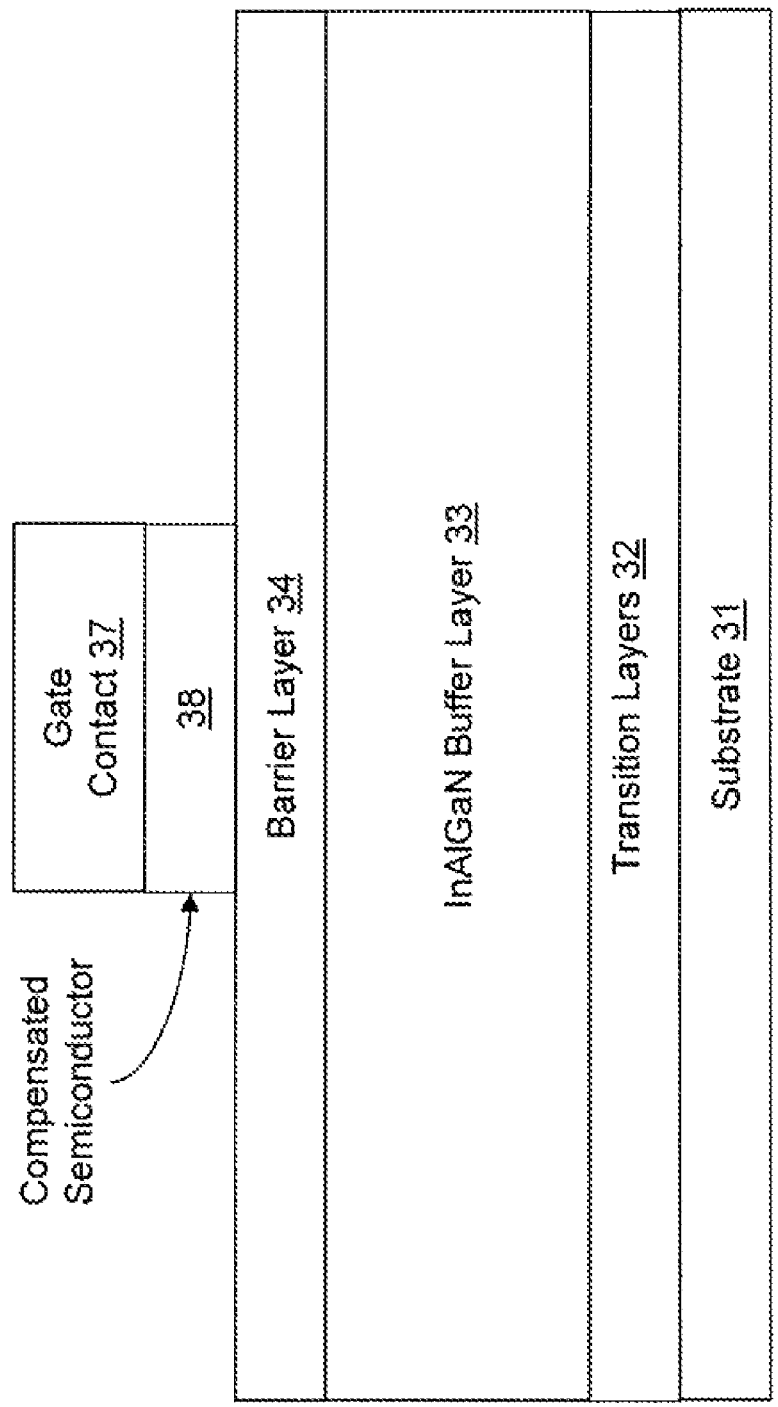
FIG. 9 is a cross-sectional view at a stage of processing subsequent to that shown in FIG. 8.

Referring to FIG. 7, the next step is to grow a compensated semiconductor layer 38 over the barrier layer 34. Referring to FIG. 8, the next step is to deposit a gate contact 37 on the compensated semiconductor layer 38. Referring to FIG. 9, the next step is to apply a gate photo mask to etch away the gate contact layer 37, and to etch away the compensated semiconductor layer 38, except the portion beneath gate contact layer 37. The gate photo resist mask is then removed. An additional hydrogen passivation can be performed by exposing the device to ammonia or hydrogen plasma at a high temperature. The final step is to provide the source and drain ohmic contacts 35, 36 over the barrier layer 34, which results in the finished GaN transistor 1 shown in FIG. 2.

Figure 1:
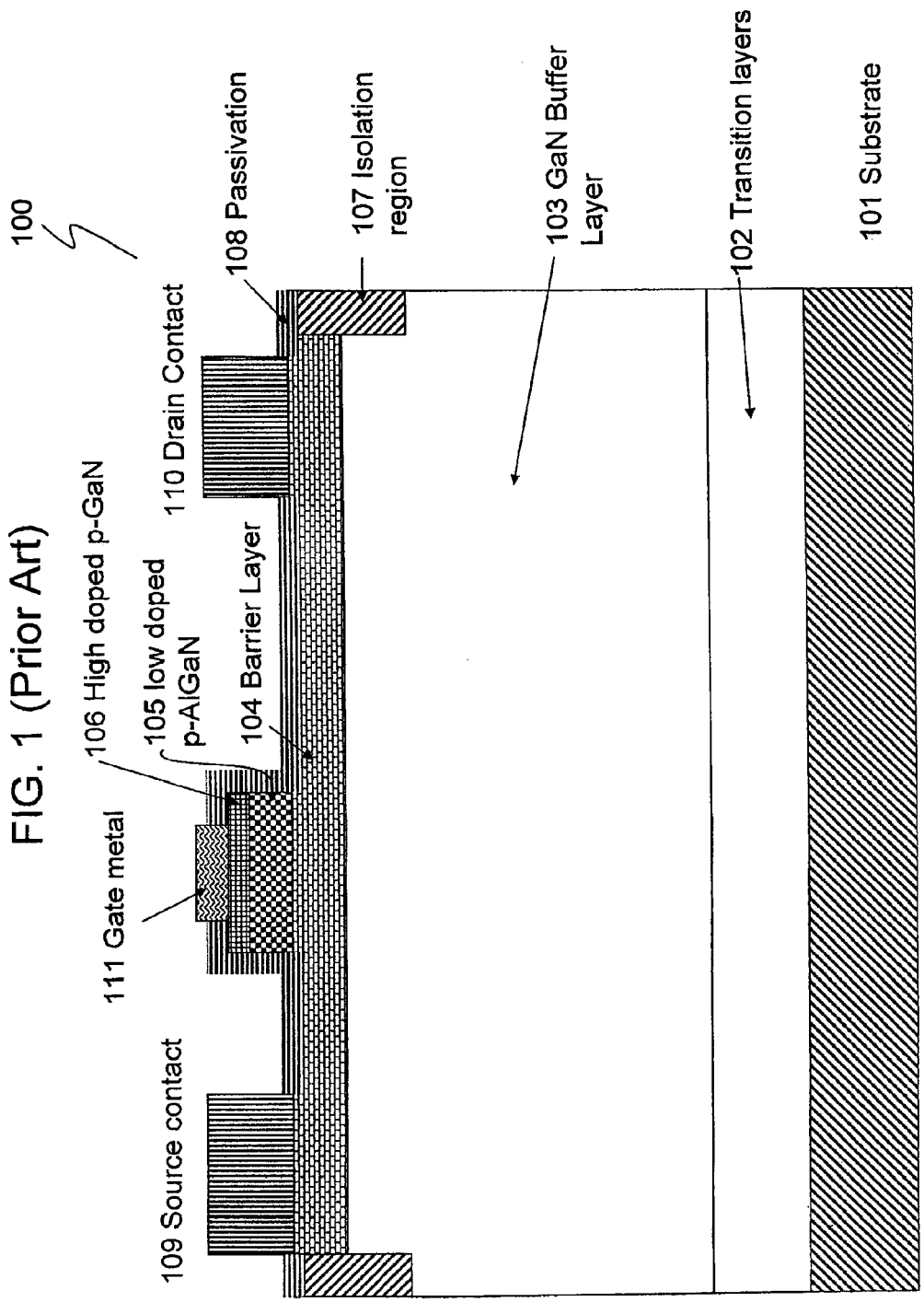
FIG. 1 is a cross-section of a prior art transistor.

The critical step in the above process that differentiates the device of the present invention from the prior art device (FIG. 1) is the passivation of a p-type impurity using hydrogen. The passivation leads to two differences. First, in GaN transistor 1, the compensated semiconductor layer 38 is a highly compensated semi-insulating material, while in GaN transistor 100 of the prior art, layer 105 is a conductive p-type material. Second, the capacitance of the gate electrode to channel layer is reduced in the present invention as compared to the prior art.

Figure 10:
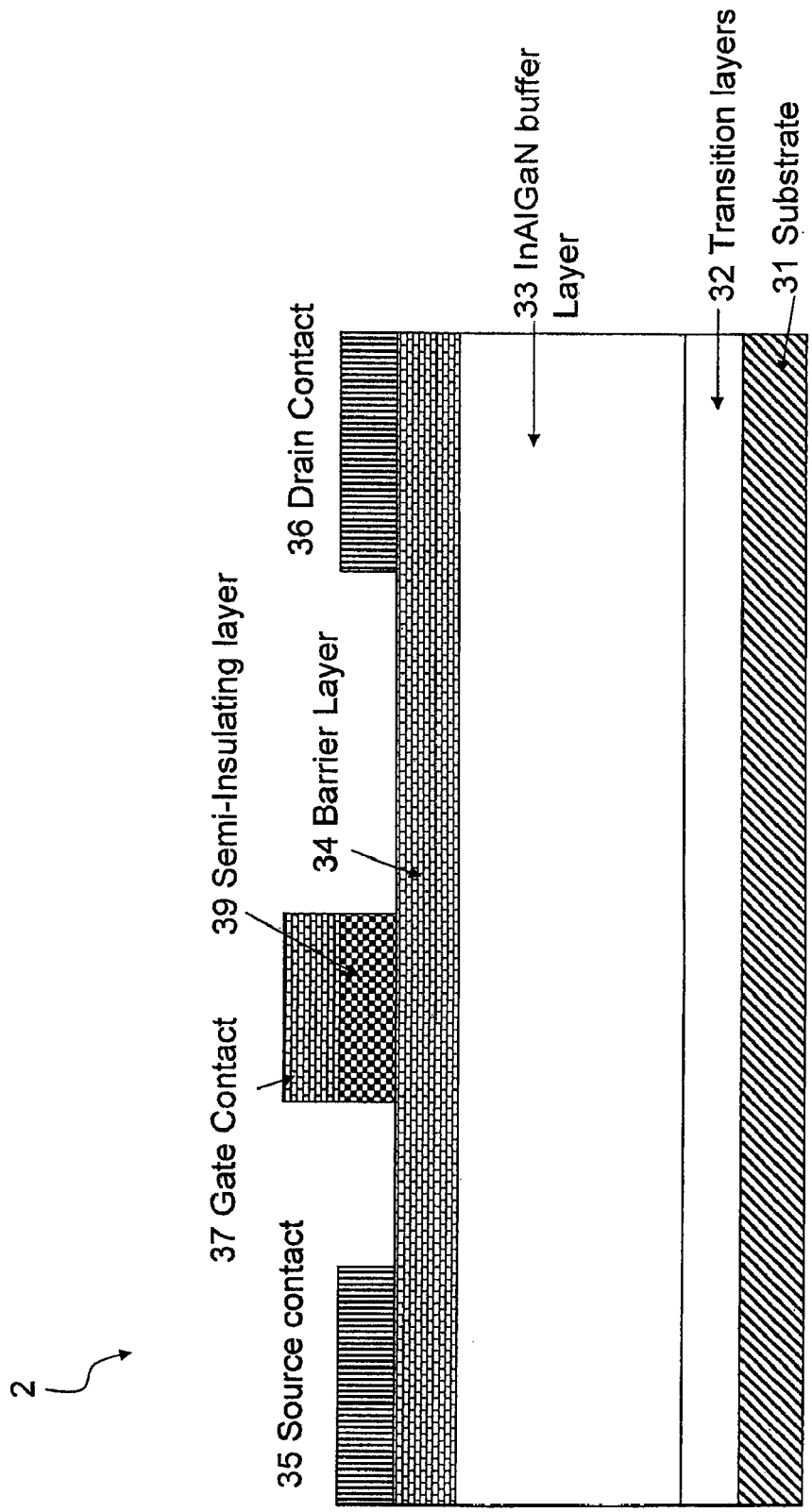
FIG. 10 is a transistor according to an embodiment described herein.

FIG. 10 shows a GaN transistor 2 according to a second embodiment of the present invention. GaN transistor 2 is similar to GaN transistor 1 (FIG. 2), except that GaN transistor 2 has a semi-insulating layer 39 in place of the compensated semiconductor layer 38 (FIG. 2). Semi-insulating layer 39 may comprise, for example, AlGaN or GaN, with deep level impurity atoms, for example, C, Fe, Mn, Cr, V, or Ni. Additionally, a GaN transistor may have both a semi-insulating layer and a compensated semiconductor layer.

The second embodiment of the invention has the same advantages as the first embodiment. The high doping of semi-insulating layer 39 leads to enhancement mode devices, the semi-insulating layer 39 leads to low gate leakage during device operation, and the insulating nature of semi-insulating 39 reduces the gate capacitance of the device. In addition, the performance of the device of the second embodiment is not as sensitive to future processing steps involving hydrogen and/or high temperatures.

Figure 11:
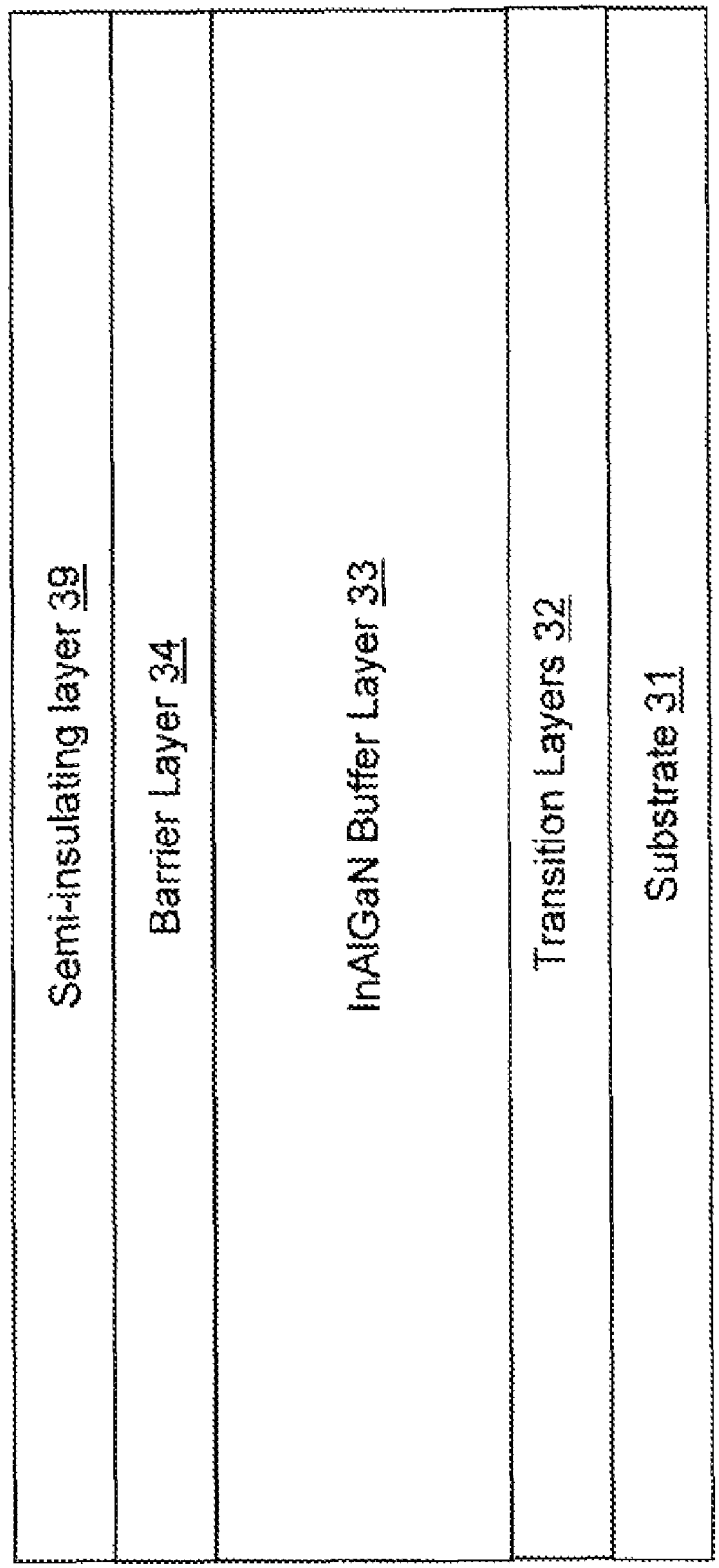
FIG. 11 is a cross-sectional view at a stage of processing subsequent to that shown in FIG. 6.

The method of manufacturing GaN transistor 2 is the same as the method of manufacturing GaN transistor 1 for the steps shown in FIGS. 3-6. Referring to FIG. 11, the next step in the production of the second embodiment, after the step shown in FIG. 6, is the growth of semi-insulating layer 39 incorporating impurity atoms.

Figure 12:
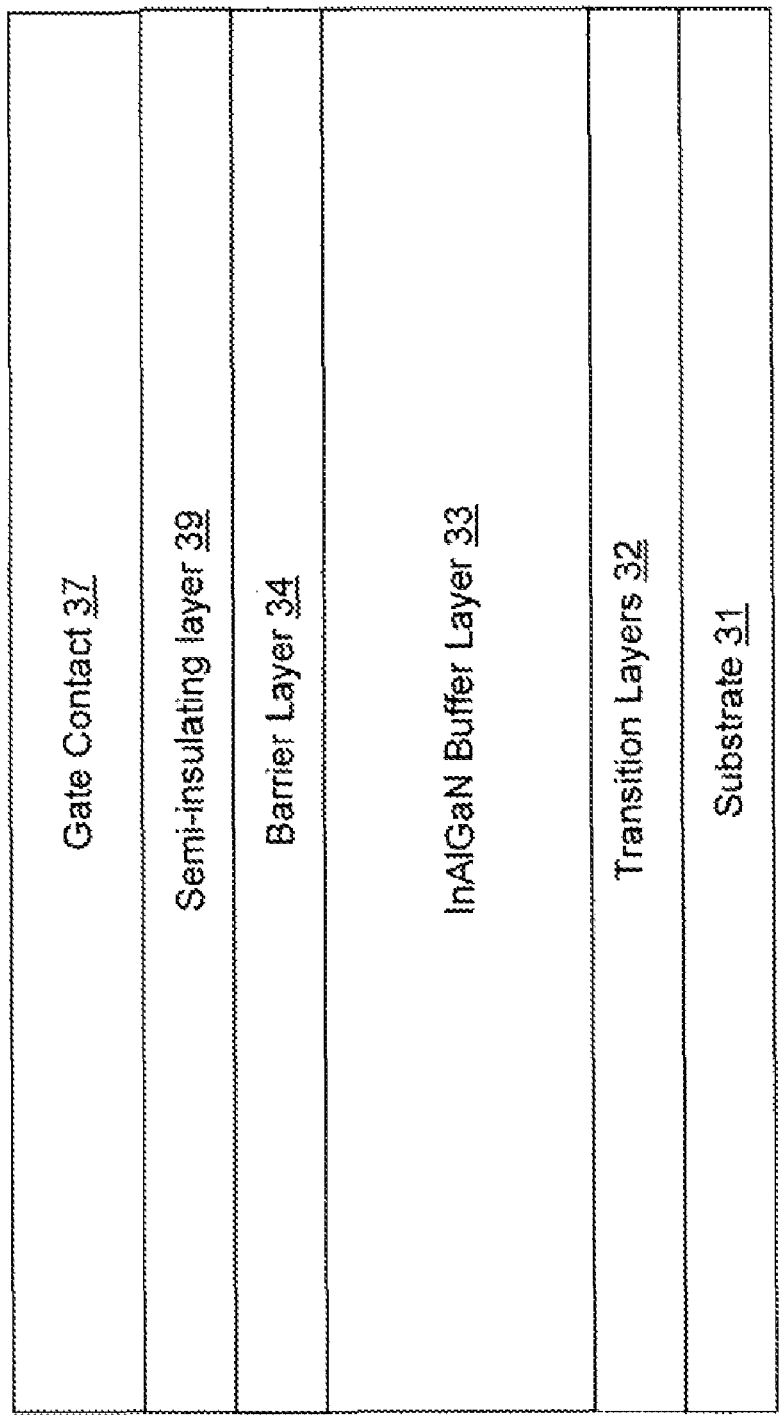
FIG. 12 is a cross-sectional view at a stage of processing subsequent to that shown in FIG. 11.
Figure 13:
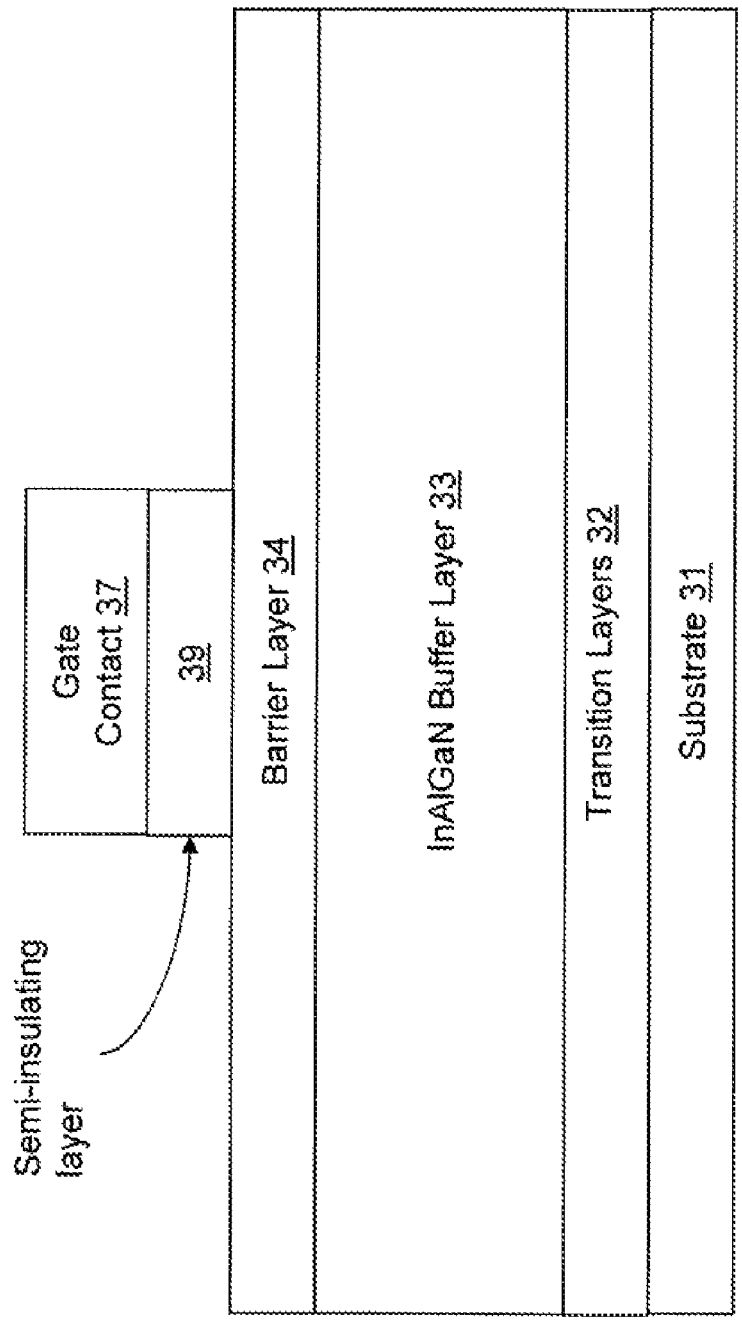
FIG. 13 is a cross-sectional view at a stage of processing subsequent to that shown in FIG. 12.

Referring to FIG. 12, the next step is to deposit a gate contact layer 37 on the semi-insulating layer 39. Referring to FIG. 13, the next step is to apply a photo mask to etch away the gate contact layer 37, and to etch away the semi-insulating layer 39, except the portion under gate contact layer 37. The photo resist mask is then removed. The next step is to provide the source and drain ohmic contacts 35, 36 over the barrier layer 34 which results in the finished device 2 shown in FIG. 10.

The device of the present invention has the following characteristics that distinguish it over the prior art: (1) the capacitance from gate to channel layer when the device is on is lower than in the prior art; (2) the gate bias can be driven much more positive without significant current through the gate (typically, in the prior art, the gate begins to conduct current between 2.5V to 3.5V), which the present invention can be driven to 5V without dramatic gate leakage occurring; and (3) hole injection from the gate into the channel layer is dramatically reduced relative to the prior art.

Figure 14:
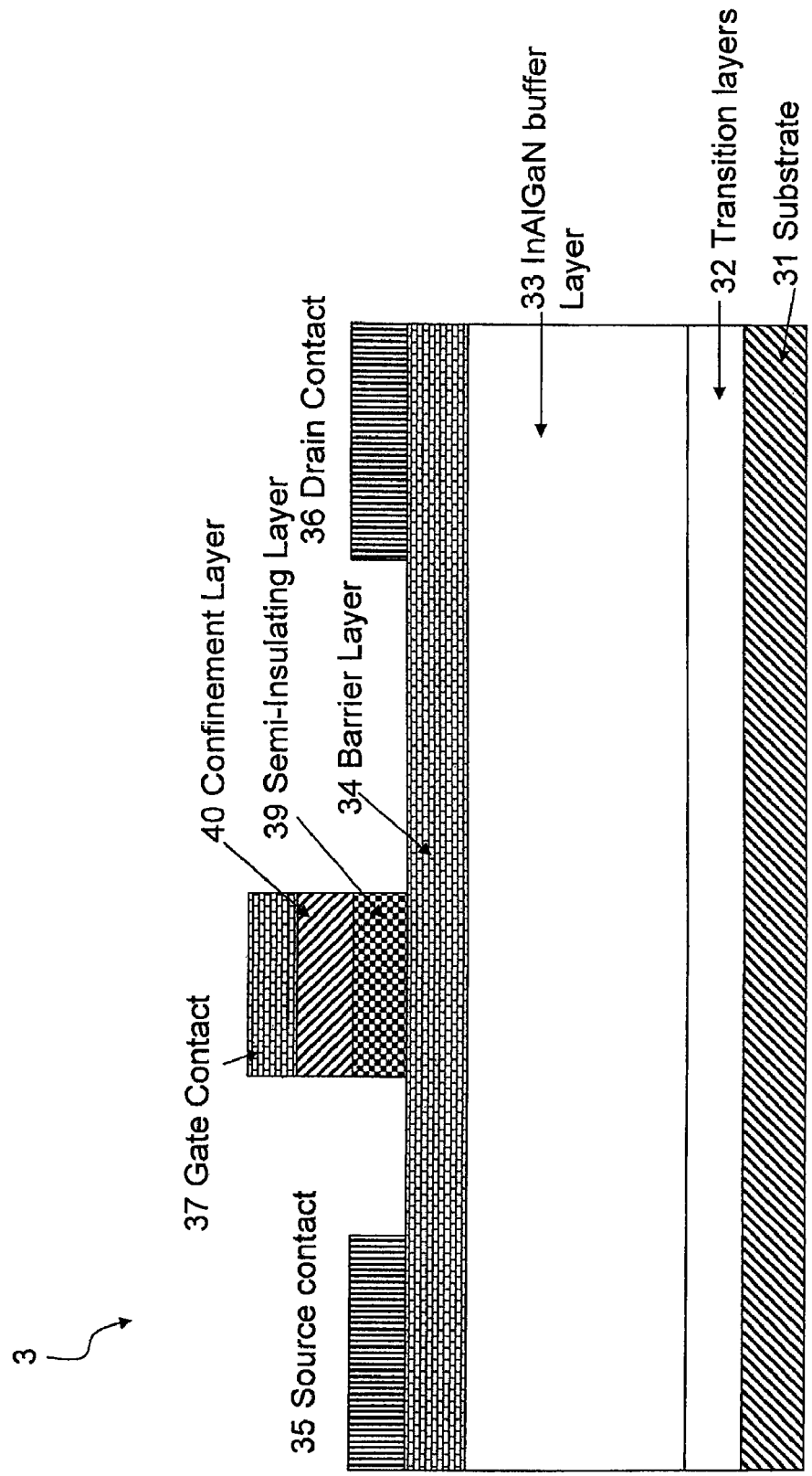
FIG. 14 is a transistor according to an embodiment described herein.

FIG. 14 shows a GaN transistor 3 according to the third embodiment of the present invention. GaN transistor 3 is similar to GaN transistor 2, except that a confinement layer is placed above the semi-insulating layer and below the gate contact layer. This confinement layer can be composed of AlGaN, SiN, $SiO_2$, or other insulating material.

Figure 15:
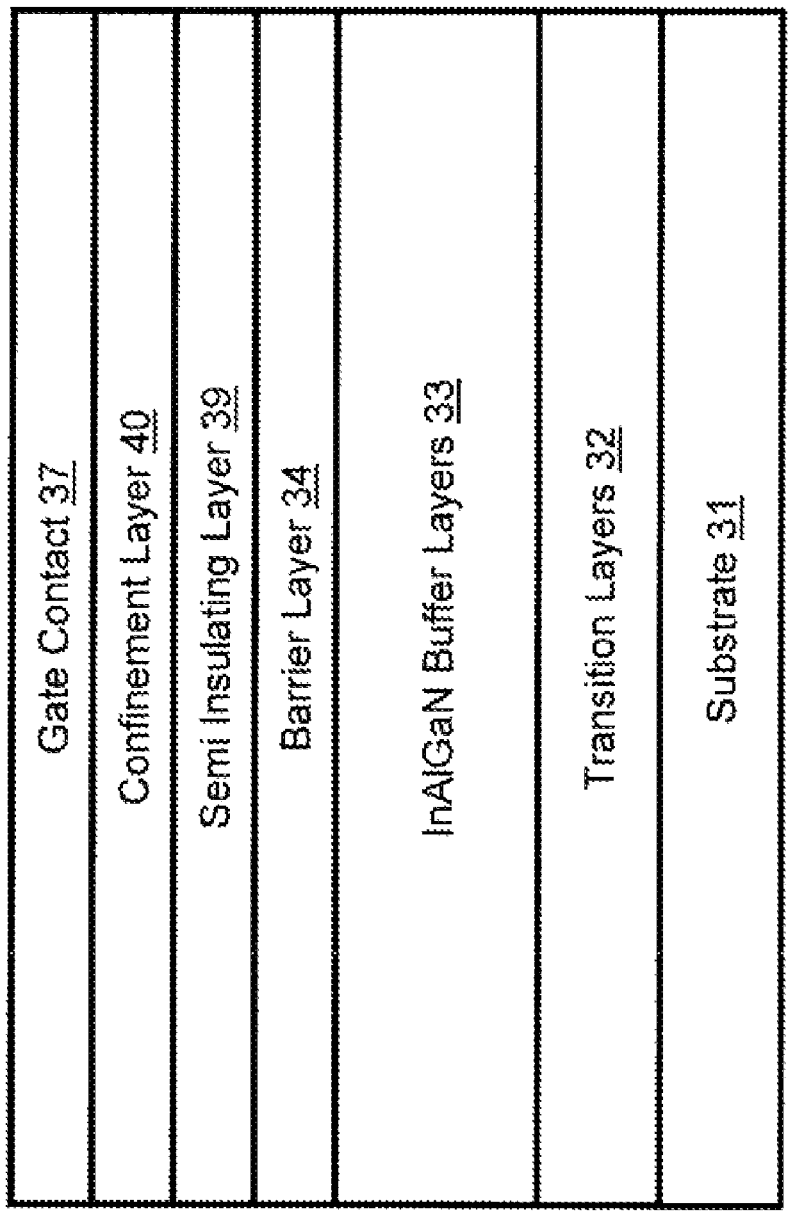
FIG. 15 is a cross-sectional view at a stage of processing subsequent to that shown in FIG. 11.

The method of manufacturing GaN transistor 3 is the same as the method of manufacturing GaN transistor 1 for steps shown in FIGS. 3-6 and GaN transistor 2 for the step shown in FIG. 11. Referring to FIG. 15, the next step is the deposition of an insulating confinement layer 40.

The third embodiment has the advantage of further reduced gate leakage compared to embodiment 1 or embodiment 2. The disadvantage is a further reduction in conductivity when the device is turned on by applying a positive voltage to the gate contact. A unique advantage of the third embodiment is the creation of a variable threshold voltage device. The confinement layer thickness can be adjusted such that very little leakage occurs under normal operating voltages, such as when the device is turned on and off, usually at 5V applied to the gate for on and 0V applied to the gate to turn the device off. However, at higher biases, current can penetrate through the confinement layer and charge the semi-insulating GaN layer. This charge is then trapped between the barrier layer and the confinement layer. This trapped charge leads to a shift in the voltage at which the device turns on and off. By appropriate application of gate voltage, the device can be changed to a depletion mode device, such that it is on at 0V on the gate. Alternatively, the device can be changed to an enhancement mode device that requires more than the gate drive to turn on, effectively making an open circuit. These two types of devices can be useful when programming an integrated circuit that controls a GaN FET with integrated gate drive.

Figure 16:
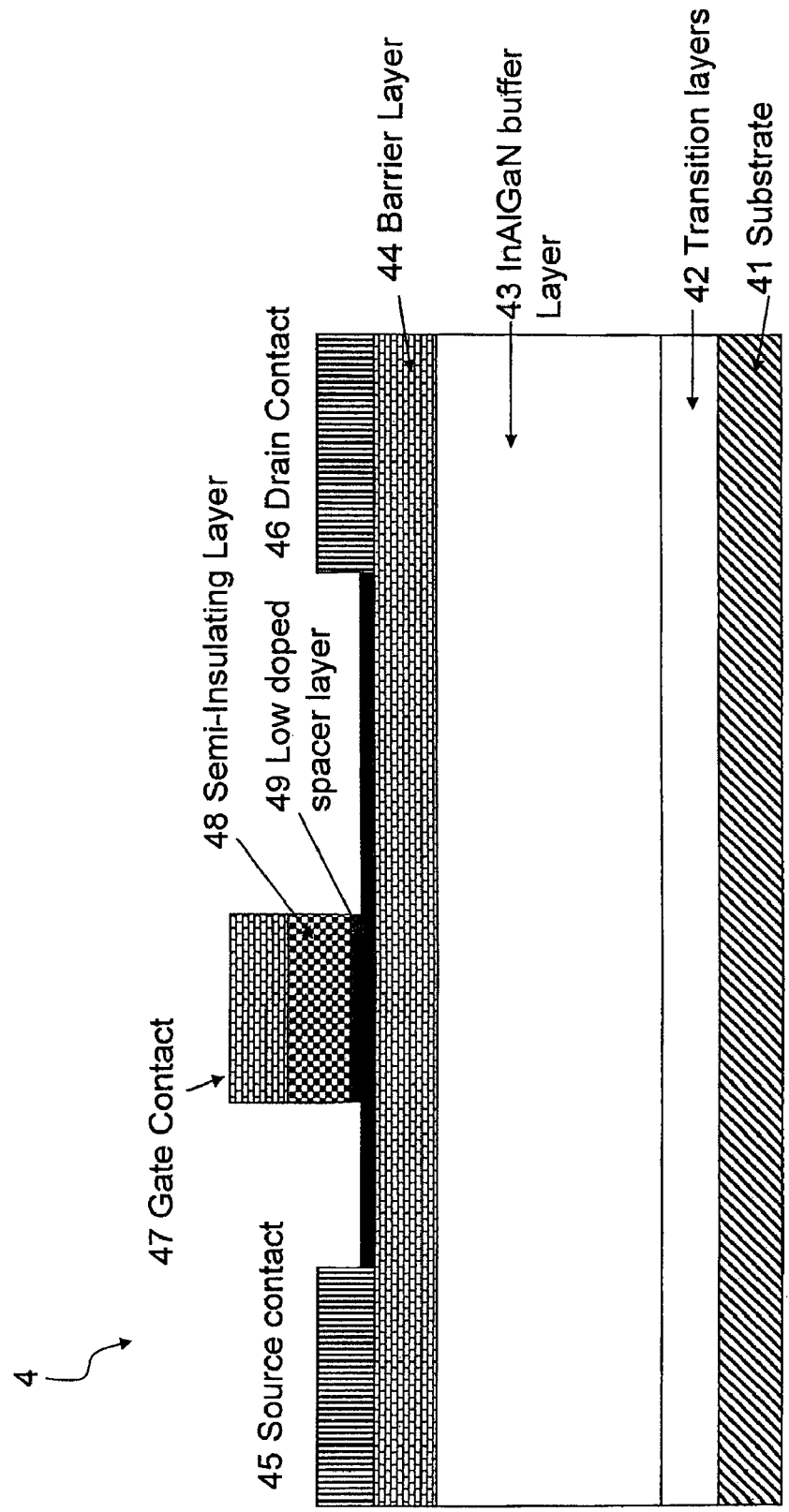
FIG. 16 is a transistor according to an embodiment described herein.

FIG. 16 shows a GaN transistor 4 according to a fourth embodiment of the present invention. GaN transistor 4 is similar to GaN transistor 2, except that it has a spacer layer 49 beneath semi-insulating layer 48 and above barrier layer 44. Associated with spacer layer 49, which is a low Mg region, is a doping offset thickness. The low Mg concentration near the barrier layer reduces the back diffusion into the barrier layer.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

We claim:

1. A column III Nitride transistor comprising:
   a substrate,
   a set of III-N transition layers above the substrate,
   a III-N buffer layer above the set of transition layers,
   a III-N barrier layer above the buffer layer,
   a compensated GaN layer above the barrier layer, and
   a gate contact above the compensated GaN layer.

2. The transistor of claim 1, wherein the compensated GaN layer contains acceptor type dopant atoms passivated with hydrogen.

3. The transistor of claim 2, where the acceptor type atoms are selected from the group consisting of Mg, Zn, Be and Ca.

4. A column III Nitride transistor comprising:
   a substrate,
   a set of III-N transition layers above the substrate,
   a III-N buffer layer above the set of transition layers,
   a III-N barrier layer, and
   a semi-insulating III-N layer above the barrier layer.

5. The transistor of claim 4, wherein the semi-insulating III-N layer contains deep acceptor type dopant atoms.

6. The transistor of claim 5 where the deep acceptor type atoms are selected from the group consisting of C, Fe, Mn, Cr and V.

7. A column III Nitride transistor comprising:
   a substrate,
   a set of III-N transition layers above the substrate,
   a III-N buffer layer above the set of transition layers,
   a III-N barrier layer,
   a semi-insulating III-N layer above the barrier layer, and
   a confinement layer above the semi-insulating III-N layer.

8. The transistor of claim 7, wherein the semi-insulating III-N layer contains deep acceptor type dopant atoms selected from the group consisting of C, Fe, Mn, Cr and V.

9. The transistor of claim 7, wherein the confinement layer is made of SiN, SiO2, Al2O3, HfO2, Ga2O3, or InAlGaN.

10. A compensated gate MISFET transistor comprising:
    a III-N barrier layer beneath a gate contact,
    a drain contact,
    a source contact, and
    a semi-insulating III-N layer between the barrier layer and the gate contact.

11. The transistor of claim 10, further comprising a confinement layer above the semi-insulating III-N layer.

12. The transistor of claim 10, further comprising a spacer layer between the semi-insulating layer and the barrier layer.

* * * * *